United States Patent [19]

Nishiura et al.

[11] Patent Number: 4,463,440

[45] Date of Patent: Jul. 31, 1984

[54] SYSTEM CLOCK GENERATOR IN INTEGRATED CIRCUIT

[75] Inventors: Yoshikazu Nishiura, Yamatokoriyama; Takitsugu Mineyama, Nara; Kazuo Inoue, Kashihara, all of Japan

[73] Assignee: Sharp Kabushiki Kaisha, Osaka, Japan

[21] Appl. No.: 254,543

[22] Filed: Apr. 15, 1981

[30] Foreign Application Priority Data

Apr. 15, 1980 [JP] Japan .................................. 55-51081
Apr. 18, 1980 [JP] Japan .................................. 55-52015

[51] Int. Cl.³ ............................................ G06F 1/04
[52] U.S. Cl. ................................. 364/900; 307/269; 307/409; 328/62
[58] Field of Search ... 364/200 MS File, 900 MS File, 364/143; 307/269, 409; 328/62

[56] References Cited

U.S. PATENT DOCUMENTS

| | | | |
|---|---|---|---|
| 3,919,695 | 11/1975 | Gooding | 364/200 |
| 4,037,090 | 7/1977 | Raymond, Jr. | 364/200 |
| 4,063,078 | 12/1977 | Das Gupta et al. | 364/200 |
| 4,137,563 | 1/1979 | Tsunoda | 364/200 |
| 4,164,666 | 8/1979 | Hirasawa | 364/900 |
| 4,191,998 | 3/1980 | Carmody | 364/200 |

Primary Examiner—Jerry Smith
Assistant Examiner—William G. Niessen
Attorney, Agent, or Firm—Birch, Stewart, Kolasch & Birch

[57] ABSTRACT

A system clock generator for use in a CMOS LSI chip includes a clock control signal generator for developing a control signal in response to a clock generating instruction or inhibition instruction; and a clock generator supplied with the output of an oscillator for developing a basic clock of a desired waveform for supply to the system, wherein the basic clock is developed or inhibited when the control signal is supplied from the clock control signal generator.

1 Claim, 10 Drawing Figures

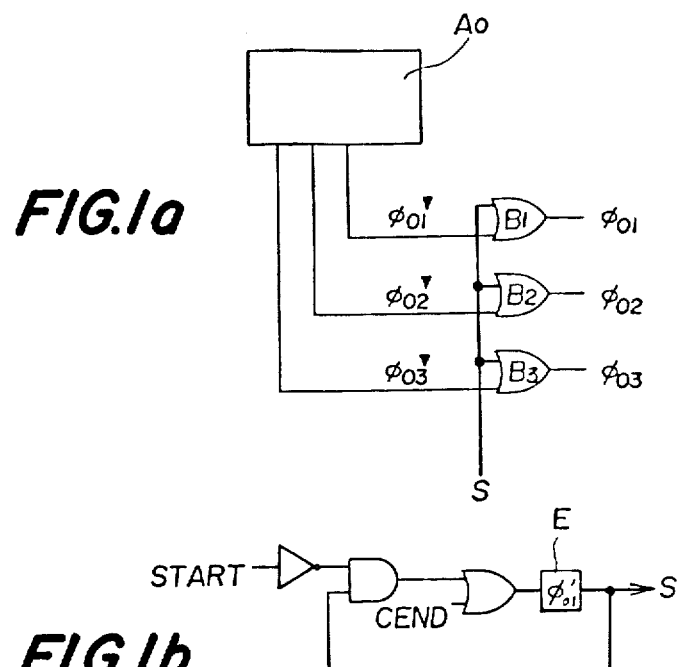
FIG.1a
FIG.1b
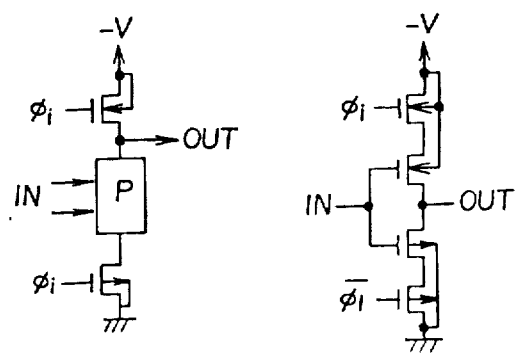
FIG.5a  FIG.5b

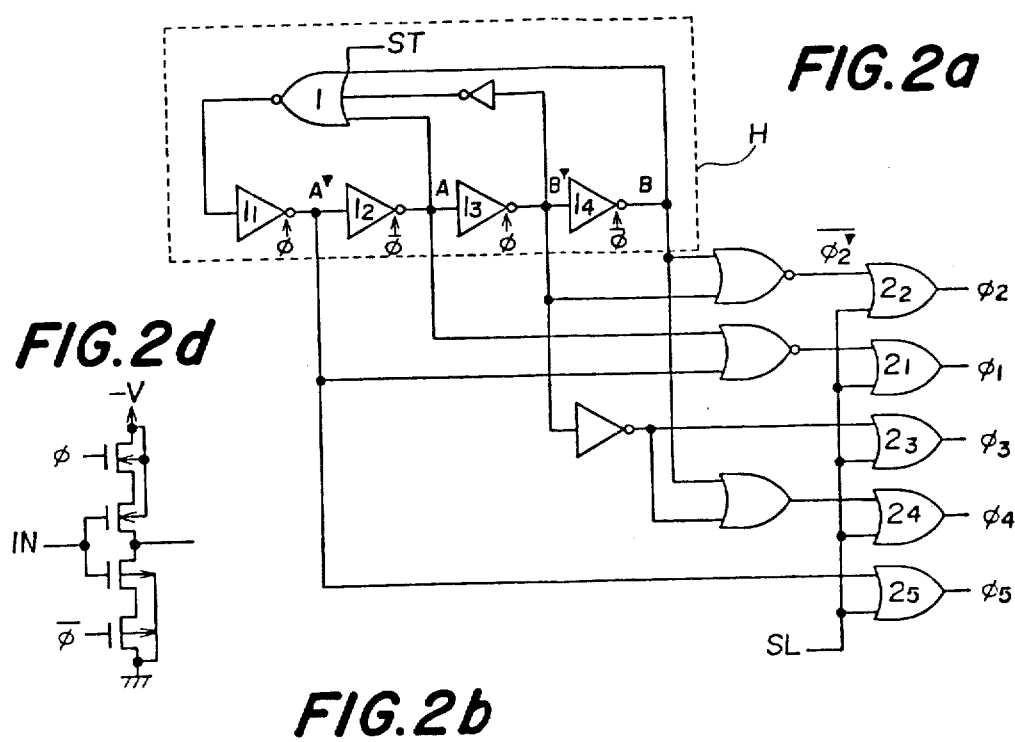
FIG.2a
FIG.2d
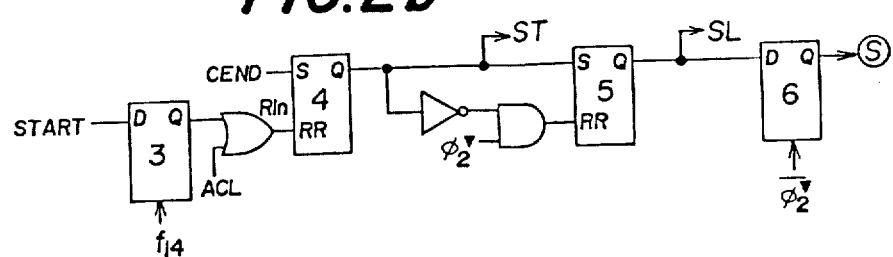
FIG.2b
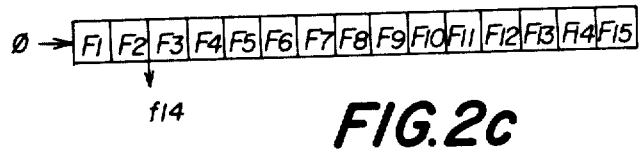
FIG.2c

SYSTEM CLOCK GENERATOR IN INTEGRATED CIRCUIT

BACKGROUND OF THE INVENTION

This invention relates to a system clock generator included in a low power consumption CMOS one-chip microcomputer.

For example, a one-chip microcomputer having a timekeeping function includes a circuit such as an oscillator and a timekeeping counter which requires clock signals whether the system is in operation or in a ready state and other circuits which do not require clock signals especially when the system is in the ready state. In this manner, clock signals useful in achieving an intended purpose through the utilization of a microcomputer can be classified into two categories, that is, ones which work even when the system is in the ready state and ones which are to be interrupted during the ready state of the whole system.

FIG. 1(a) shows a prior art system clock generator wherein clock signals $\phi_{01}'$, $\phi_{02}'$ and $\phi_{03}'$ developed from a basic clock generator $A_0$ work during the ready state of the system. By controlling gate circuits $B_1$–$B_3$ with a system control signal S with regard to these clock signals, there are developed different clock signals $\phi_{01}$, $\phi_{02}$ and $\phi_{03}$ which are interrupted during such ready state. FIG. 1(b) shows a circuit for creating the system control signal S, which circuit includes a dynamic circuit E responsive to the clock signals $\phi_{01}'$, $\phi_{02}'$ and $\phi_{03}'$. To this end, even while the system is in the ready state, circuits related with the clock signals $\phi_{01}'$, $\phi_{02}'$ and $\phi_{03}'$ work at all times, for example, the circuit E included in the system cntrol signal generator. This is unfavorable from the viewpoint of power saving.

OBJECTS AND SUMMARY OF THE INVENTION

Accordingly, it is an object of the present invention to provide a system clock generator which overcomes the above discussed prior art problem.

It is another object of the present invention to provide a system clock generator which includes a clock control signal generator implemented by a logic circuit for interrupting the supply of system clock signals and saving power except for a minimum number of circuits absolutely requiring the system clock signals when the system is in the ready state.

BRIEF DESCRIPTION OF THE DRAWINGS

For a more complete understanding of the present invention and for further objects and advantages thereof, reference is now made to the following description taken in conjunction with the accompanying drawings showing a mode selection assembly for use in a tape recorder or the like in accordance with an embodiment of the present invention, in which:

FIGS. 1(a) and 1(b) are block diagrams of a prior art circuit arrangement;

FIGS. 2(a) and 2(b) are block diagrams showing an essential part of an embodiment of the present invention;

FIG. 2(d) is a circuit diagram of the details of the essential part shown in FIG. 2(a);

FIGS. 5(a) and 5(b) are circuit diagrams of a dynamic circuit which is part of the whole system.

DETAILED DESCRIPTION OF THE INVENTION

Figure 3:
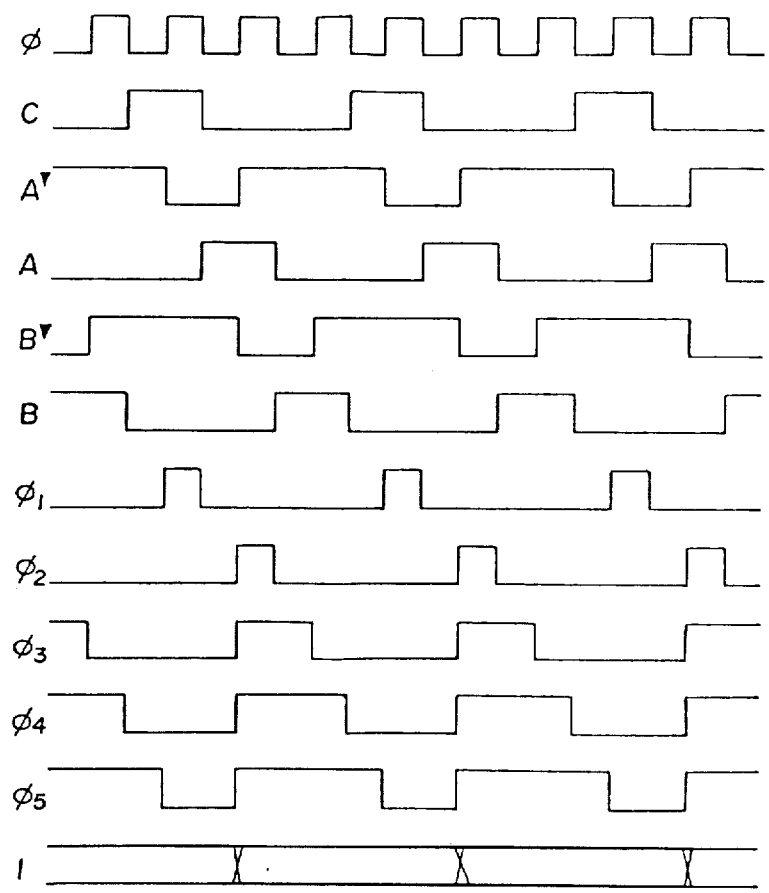
FIG. 3 is a waveform diagram of output signals developed at respective nodes in FIG. 2(a)

Referring to FIG. 2(a), there is shown a system clock generator included in a one-chip CMOS microcomputer in accordance with the present invention, wherein a block H designated by the dotted line is adapted to generate a basic clock signal from which system clock signals $\phi_1$–$\phi_5$ are developed. The basic clock generator section H in the system clock generator comprises a series of serially connected inverters $I_1$–$I_4$ clocked with clock signals $\phi$, $\phi$. The outputs of the inverters $I_2$ and $I_4$ and the reversed output of the inverter $I_3$ are connected to the input of the inverter $I_1$ via a NOR gate I. The input of the NOR gate I is further supplied with an inhibit signal ST as for generation of the basic clock signals. When the inhibit signal ST is "0", the clocked inverters constitute a ½ divider and a system clock $\phi_5$ is developed by the output of the inverter $I_1$, a clock $\phi_4$ is developed by the OR'ed output of the the reversed output of the inverter $I_3$ and the output of the inverter $I_4$, a clock $\phi_3$ by the reversed output of the inverter $I_3$, a clock $\phi_2$ by the NOR'ed output of the outputs of the inverters $I_3$ and $I_4$ and a clock $\phi_1$ by the NOR'ed output of the outputs of the inverters $I_1$ and $I_2$. The respective inverters $I_1$–$I_4$ are implemented with CMOS inverters supplied with a clock signal of 32,768 Hz, for example, from a quartz oscillator. The relationship between the outputs A, A', B and B' at the output terminals of the respective inverters, the output signal C of the NOR gate 1 and the clocks $\phi_1$–$\phi_5$ are illustrated in FIG. 3. There waveforms are depicted provided that clock control signals as discussed below are both "0".

The resultant signals $\phi_1$–$\phi_5$ are supplied to a CPU for actuation thereof. In FIG. 3, I represents a cycle for an instruction for CPU, which cycle is defined from the leading edge of the system clock $\phi_2$—to the leading edge of the succeeding clock $\phi_2$. The signal ST supplied to the NOR gate 1 in the system clock generator of FIG. 2(a) is the clock control signal for interrupting the operation of the basic clock generator. The signal SL supplied to OR gates $2_1$–$2_5$ is the clock control signal which discontinues the generation of the system clocks as developed from the clock control signal generator of FIG. 2(b). The clock control signal generator comprises D type flip flops 3 and 6, and RS type flip flops 4 and 5; the signal ST being derived from the output Q of the RS type flip flop 4 and the signal SL from the output Q of the RS type flip flop 5. The system clock generator embodying the present invention as shown in FIGS. 2(a), 2(b) and 2(c) is build up by a CMOS complementary static circuit arrangement except for the clocked inverters. In the system clock generator, the basic clock generator section H is inhibited from operating when the signal ST is "1". The signals A', A, B' and B from the output terminals of the respective inverters are "1", "0", "1" and "0" so that no power is consumed for charging and discharging in generating the basic clock signal. Under these circumstances, when the reset input to the RS type flip flop 5 in the clock control circuit is "0", the signal SL is "1" and supplied to the OR gates $2_1$–$2_5$ and the system clocks $\phi_1$–$\phi_5$ are all "1" and held at this logic level. The whole system is interrupted with the respective nodes at predetermined logic levels "1" or "0". The quartz oscillator and a binary counter section are all that consume power in the CMOS circuit arrangement except for a very little amount of leak current.

It is noted that the one-chip microcomputer includes not only the static circuit but also a dynamic circuit supplied with a system clock $\phi_i$ as shown in FIGS. 5(a) and 5(b). By holding the system clocks at a given level, the circuit (a) is placed into the precharge state with its output at "0" and the circuit (b) serves as merely an inverter. Accordingly, the system is disabled with the respective nodes held at predetermined levels "1" or "0".

The clock control signal generator of FIG. 2(b) will now be described in more detail. A signal ACL assumes a "1" level shortly after power throw to the system and brings the system into its initial state when ST="0" and SL="0". The following description is proceeded with the signal ACL="0."

A signal CEND supplied to the set terminal of the RS type flip flop 4 is a micro-instruction developed when a clock inhibit instruction in a string of instructions is executed during operation of the system. With the system in the ready state, the signal CEND is held "0." A start signal START supplied to the D type flip flop 3 comes from a CMOSLSI input circuit or the binary counter of FIG. 2(c) via the static circuit which does not operate with the system clocks in the ready state. A clock $f_{14}$ supplied to the clock terminal of the D type flip flop 3 is derived from the second stage of the binary counter of FIG. 2(c) and used as a sychro signal in association with a fixed time when the system goes into the operating state in response to the start signal START. The clock signals $\phi_{2'}$ and $\phi_{2'}$ serve the same purpose.

Figure 4:
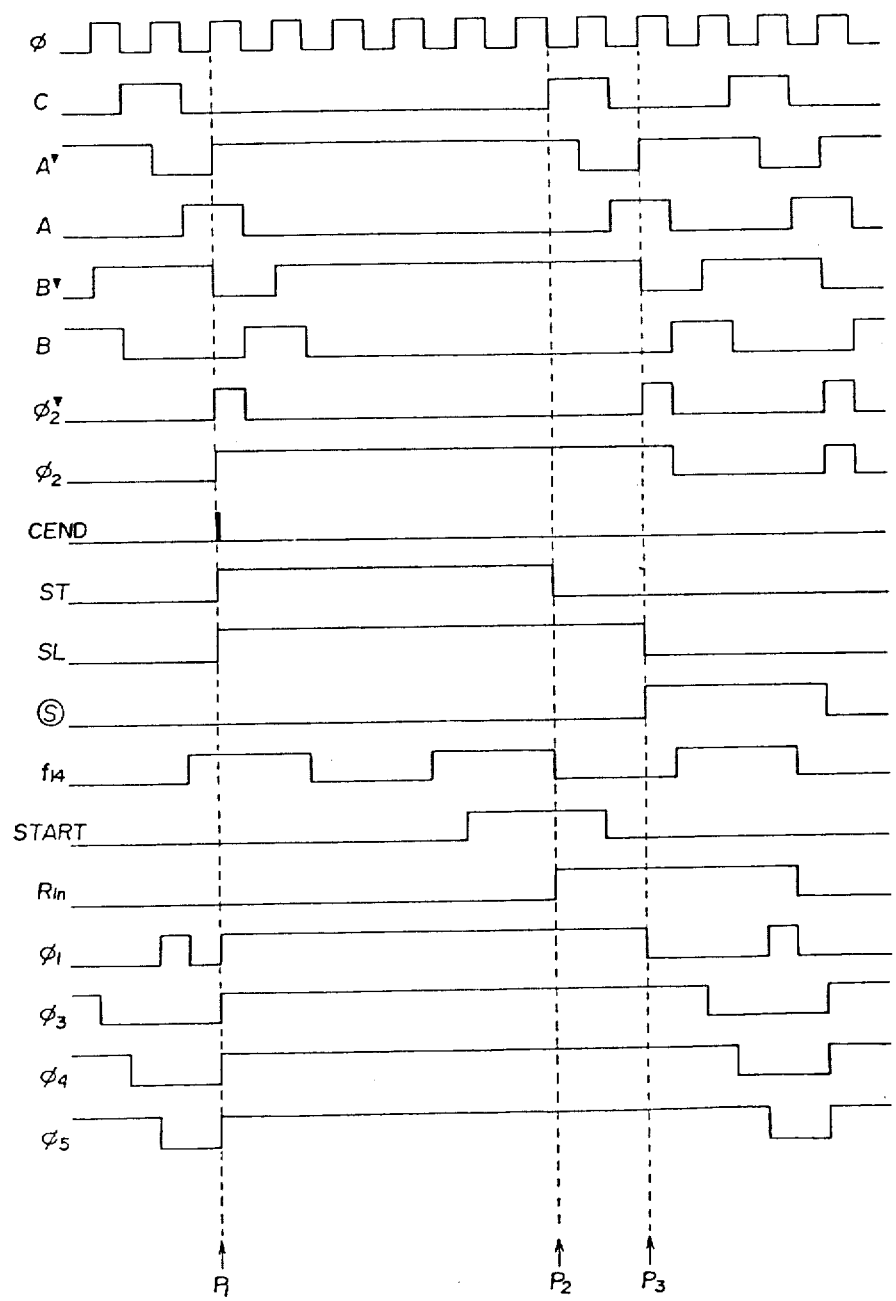
FIG. 4 is a timing chart for explanation of the operation of the illustrated embodiment of the present invention.

The events in operation when the system is shifted from the operating state to the ready state or back again to the operating state will be described with reference to a timing chart of FIG. 4. In the event that an instruction is developed during operation of the system, the clock inhibit signal CEND goes high (the point $P_1$) at the begining of the instruction cycle (the leading edge of $\phi_{2'}$), thus placing the flip flops 4 and 5 into the set state. The basic clock generator is discontinued in response to the signal ST so that the system clocks $\phi_1$–$\phi_5$ are held at the given levels and the system is in the ready state (the point $P_1$). It is noted that the signal CEND is "0" when all of the system clocks are "1" and the system is in the precharge state. As long as no signal START is developed the system is held in the ready state with the aid of the signals ST and SL. When the signal START is applied at any time, a signal $R_{in}$ originating from the output of the flip flop 3 is developed in synchronism with the trailing edge of the clock $f_{14}$ as seen from the timing chart (the point $P_2$). Since the flip flop 4 is reset in response to the signal $R_{in}$, the signal ST is reset to release the basic clock generator section H from its disabled state, thus sequentially developing the signals A', A, B' and B. When the basic clock generator section H operates again and the basic clock $\phi_{2'}$, the signal SL originating from the output of the flip flop 5 is reset and the system clocks $\phi_1$, $\phi_3$, $\phi_4$ and $\phi_5$ are developed after the system clock $\phi_2$.

The clock $f_{14}$ supplied to the flip flop 3 ensures that the clocked inverters are in a one state for half cycle of the clock $\phi$ when the signal ST is reset in synchronism with the trailing edge of the clock $\phi$ and the output waveform C is transferred from the NOR gate $I_1$ of the basic clock generator section into the inverter $I_1$. The clock $\phi$ or the output of any state of the binary counter of FIG. 2(c), as an alternative to the clock $f_{14}$, may achieve the same purpose. The reason why the system clocks begin with $\phi_2$ in synchronism with the basic clock $\phi_{2'}$ is that the instruction cylce of the CPU in the illustrated embodiment starts with the system clock $\phi_2$. A signal s developed from the flip flop 6 during the instruction cycle beginning with the point $P_3$ serves to establish a proper address in a program counter in the CPU at the beginning and may inhibit any other instruction from developing, thus providing a smooth start of operation. It is obvious that the above circuit arrangement is useful for a watch module with a timekeeping function, an alarm function and a stop watch function with power saving feature.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A system clock generator comprising:
   clock signal generating means for developing a plurality of sequentially phase shifted clock pulses;
   logic means responsive to said clock signal generating means for developing system clock output signals from said sequentially phase shifted clock pulses;
   clock control signal generator means operatively connected to said clock signal generating means and said logic means for developing a clock inhibit signal for inhibiting operation of said clock signal generating means and for developing a system clock output signal inhibit signal;
   disable means for inhibiting application of said system clock output signals to an output when said system clock output signal inhibit signal is developed by said clock control generation means;
   said clock control signal generator means including;
   first means for developing said clock inhibit signal,
   second means responsive to said first means for developing said system clock output signal inhibit signal, the development of said clock inhibit signal by said first means being terminated in response to a start signal applied thereto,
   said second means terminating development of said system clock output signal inhibit signal only when development of said clock inhibit signal has been terminated by said first means and said second means has detected development of a selected one of said system clock output signal to thereby syncronize timing of said clock pulse and system clock output signals.

* * * * *